US009112009B2

(12) United States Patent
Charles et al.

(10) Patent No.: US 9,112,009 B2
(45) Date of Patent: Aug. 18, 2015

(54) III-NITRIDE DEVICE WITH BACK-GATE AND FIELD PLATE FOR IMPROVING TRANSCONDUCTANCE

(75) Inventors: Alain Charles, Compiegne (FR); Hamid Tony Bahramian, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 916 days.

(21) Appl. No.: 12/211,162

(22) Filed: Sep. 16, 2008

(65) Prior Publication Data

US 2010/0065923 A1    Mar. 18, 2010

(51) Int. Cl.
| | | |
|---|---|---|
| *H01L 29/778* | (2006.01) | |
| *H01L 29/40* | (2006.01) | |
| *H01L 29/423* | (2006.01) | |
| *H01L 29/20* | (2006.01) | |

(52) U.S. Cl.
CPC .......... *H01L 29/7787* (2013.01); *H01L 29/407* (2013.01); *H01L 29/42356* (2013.01); *H01L 29/2003* (2013.01)

(58) Field of Classification Search
CPC ..................................... H01L 29/778–29/7789
USPC .................... 257/192–195, E29.246–E29.253
See application file for complete search history.

(56) References Cited

U.S. PATENT DOCUMENTS

| | | | | |
|---|---|---|---|---|
| 4,821,093 | A * | 4/1989 | Iafrate et al. .................. | 257/194 |
| 5,252,842 | A * | 10/1993 | Buck et al. ..................... | 257/192 |
| 6,720,589 | B1 * | 4/2004 | Shields .......................... | 257/194 |
| 7,244,974 | B2 * | 7/2007 | Saito et al. ..................... | 257/194 |
| 7,859,018 | B2 * | 12/2010 | Iwakami et al. ............... | 257/194 |
| 2007/0210329 | A1 * | 9/2007 | Goto ............................. | 257/147 |
| 2007/0272957 | A1 * | 11/2007 | Johnson et al. ........ | 257/E29.255 |
| 2008/0023706 | A1 * | 1/2008 | Saito et al. ....................... | 257/76 |
| 2008/0185613 | A1 * | 8/2008 | Beach et al. .................. | 257/192 |
| 2009/0072272 | A1 * | 3/2009 | Suh et al. ....................... | 257/194 |

FOREIGN PATENT DOCUMENTS

WO    WO2008/128160    * 10/2008

* cited by examiner

*Primary Examiner* — Stephen W Smoot
*Assistant Examiner* — Sun M Kim
(74) *Attorney, Agent, or Firm* — Farjami & Farjami LLP

(57) ABSTRACT

A III-Nitride device has a back-gate disposed in a trench and under and in close proximity to the 2 DEG layer and in lateral alignment with the main gate of the device. A laterally disposed trench is also disposed in a trench and under and in close proximity to the drift region between the gate and drain electrodes of the device. The back-gate is connected to the main gate and the field plate is connected to the source electrode. The back-gate can consist of a highly conductive silicon substrate.

25 Claims, 6 Drawing Sheets

III-NITRIDE DEVICE WITH BACK-GATE AND FIELD PLATE FOR IMPROVING TRANSCONDUCTANCE

FIELD OF THE INVENTION

This invention relates to III-Nitride devices and processes for their manufacture and more specifically relates to the improvement of the leakage, subthreshold leakage and transconductance characteristics of such devices.

BACKGROUND OF THE INVENTION

III-Nitride devices are normally-on depletion mode (D-mode) devices. A negative voltage is applied to the gate of the device to turn it off. In a typical III-Nitride device, an AlGaN layer atop a GaN layer forms a 2 DEG, normally conductive layer which conducts under a control gate and between a source and a drain electrode atop and in contact with the AlGaN layer.

However, leakage paths exist in the GaN layer which is normally relatively highly doped. The device also suffers from sub-threshold characteristics and relatively poor transconductance characteristics.

It would be desirable to provide a III-Nitride device which improves the leakage, the subthreshold characteristics and transconductance of such devices while employing well known processing techniques for its manufacture.

BRIEF DESCRIPTION OF THE INVENTION

In accordance with the invention, a back-gate and/or a field plate is applied to an otherwise standard III-Nitride device.

In one embodiment of the invention, a secondary gate (or back-gate) is added below the GaN layer or channel layer of the device.

In this embodiment, the III-Nitride device is fabricated using well known fabrication techniques. The substrate for the device may be silicon, sapphire or GaN or the like. The substrate may include a transition layer to improve growth of a GaN layer atop the substrate. After the fabrication of the III-Nitride device, the backside substrate is etched (in a process similar to that used for through-via etch techniques). The backside etch may form a trench under selected locations of the substrate. The backside substrate may be thinned before the etch is carried out. A gate metal is then deposited into the desired etched area and patterned. This metal forms the secondary gate (or back-gate).

The back-gate can be connected to the main gate or can have a separate terminal. The application of a negative voltage to the back-gate reduces the conductivity in the leakage paths in the GaN layer and also improves the subthreshold characteristics. The transconductance of the device is also improved, since the back-gate introduces 2 DEG channel control from the backside. The back-gate size may be varied to achieve optimal subthreshold and transconductance characteristics.

In a further embodiment, a field plate can be placed (in addition to the back-gate or alone), under the drift region of the device. By applying an appropriate bias to the field plate (e.g. connecting the field plate to the source), one is able to shape the electric field in the drift region and close to the gate region, thus enabling higher breakdown voltage, less impact ionization and more reliable device operation.

In a still further embodiment, the backside substrate chosen is silicon which is highly doped. This highly conductive silicon may be connected to the gate (to improve device characteristics as a black-gate) or to the source (to act as field plate). With the highly conductive substrate technique, one needs to control the extra charge that is introduced by the large back-side gate.

DETAILED DESCRIPTION OF THE PREFERRED EMBODIMENTS

Referring next to the drawings, the same numerals are used to identify similar or identical components. The invention herein is not to be limited to the structure described, but is defined by the claims appended hereto.

Figure 1:
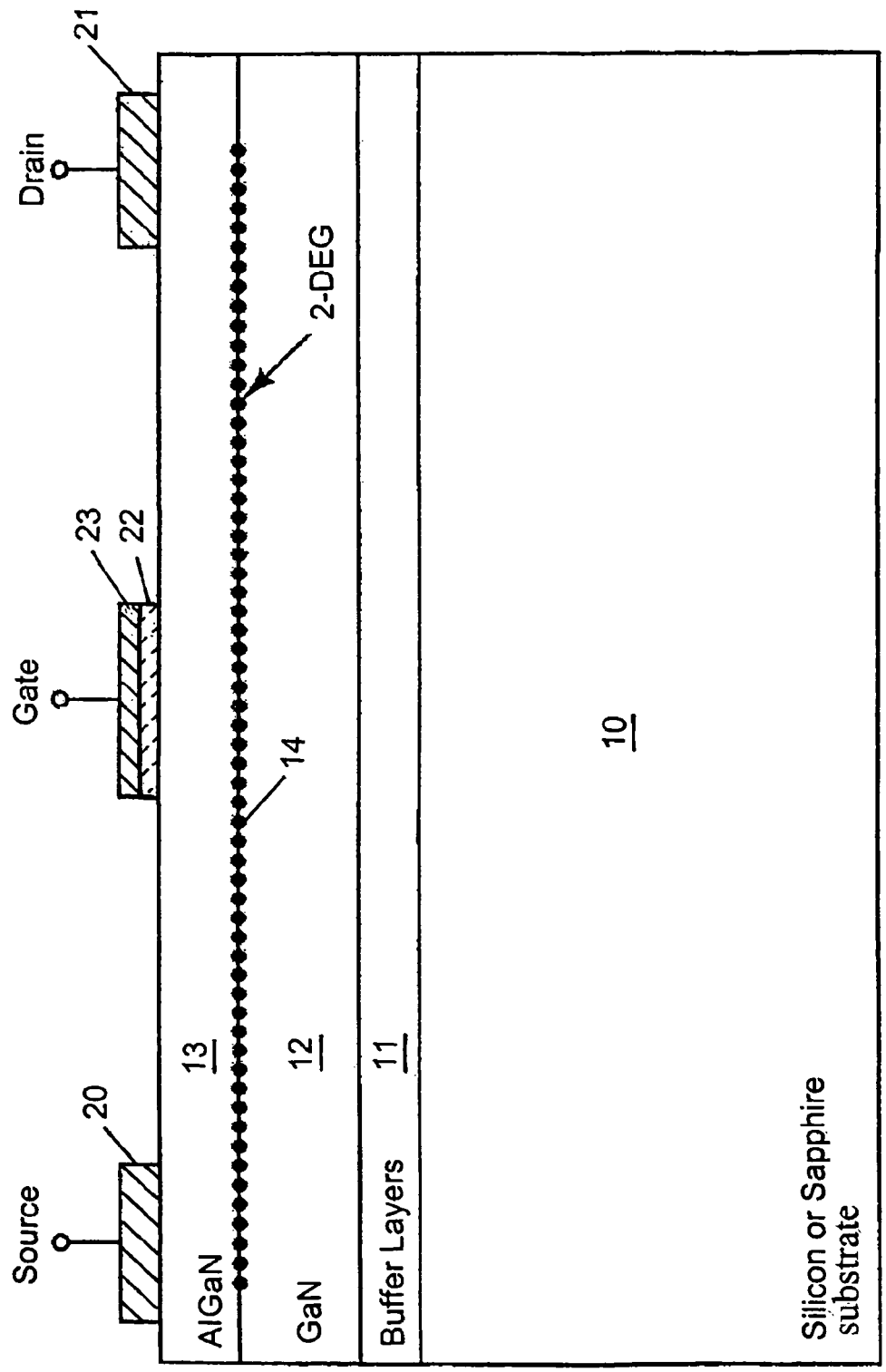
FIG. 1 is a cross-section of a small area or one cell of a known III-Nitride device which can have its characteristics improved by the invention.

FIG. 1 shows a typical III-Nitride device in which a conventional substrate 10, which may be silicon, sapphire, GaN or the like, supports the remaining device. A transition buffer layer 11, which is conventional, may be formed atop substrate 10 and can be considered a part of substrate, to assist in matching the expansion and thermal characteristics of a first III-Nitride layer (shown as a GaN layer 12) to the substrate 11. A second III-Nitride layer 13, shown as an AlGaN layer is then deposited atop GaN layer 12. The interface between layers 12 and 13 forms a conductive 2 DEG layer shown by the dotted line 14 (which represents a conductive layer of electrons).

Spaced conductive source and drain electrodes 20 and 21 respectively are conventionally formed and are connected to the top surface of III-Nitride layer 13. A gate dielectric 22 is also conventionally formed atop layer 13 and between electrodes 20 and 21 and a conventional conductive gate 23 is formed atop gate dielectric 22.

Note that a Schottky gate structure can also be used in which the gate metal directly contacts the top surface of AlGaN layer 13.

Any desired gate structure could be used, including the floating gate structure of copending application Ser. No. 12/195,801, filed Aug. 21, 2008 in the name of Bahramian and assigned to the assignee of this application and incorporated herein by reference in its entirety (IR-3581).

The process steps used to make the device of FIG. 1 are well known to those of ordinary skill in this art.

Figure 2:
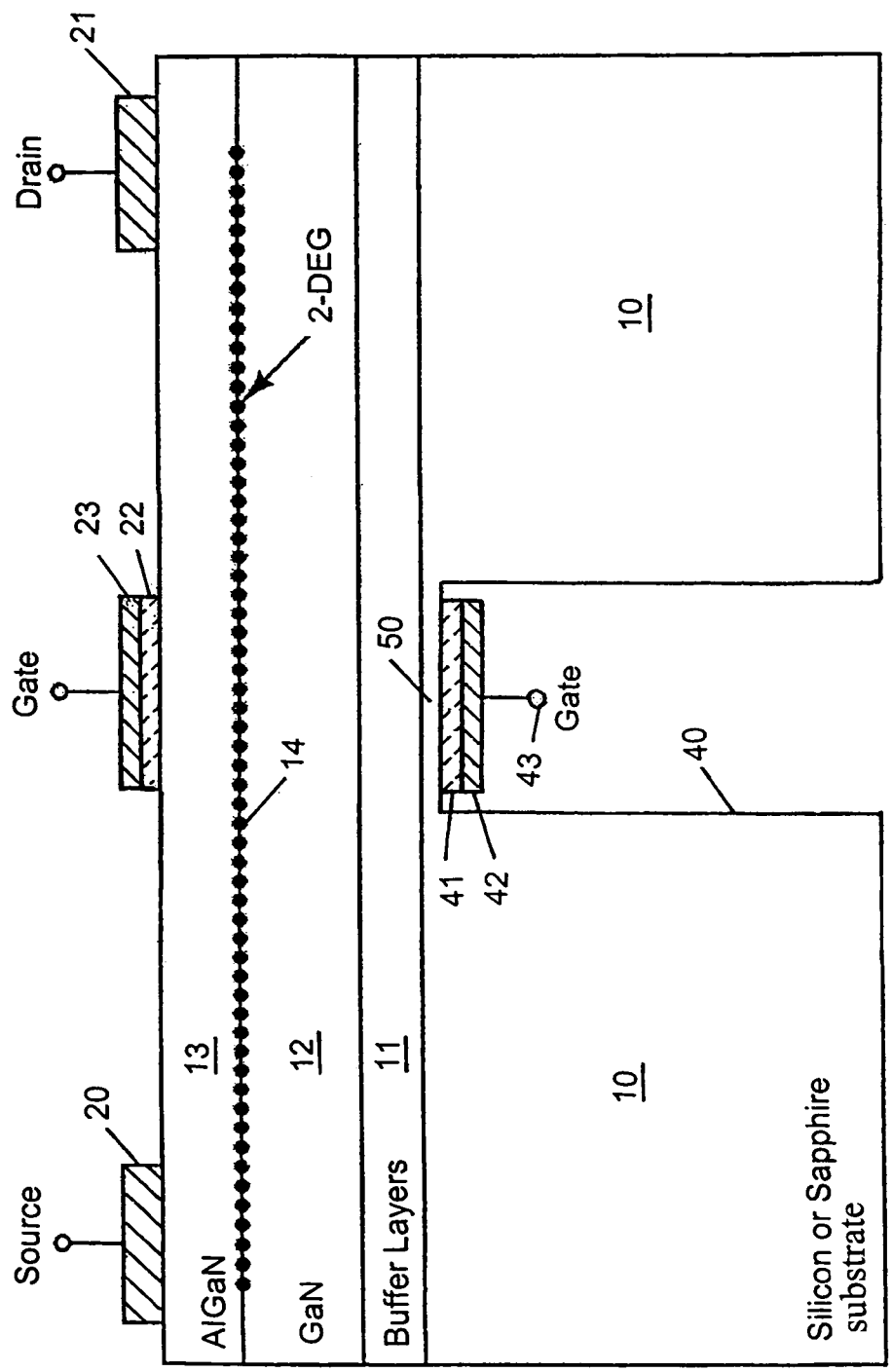
FIG. 2 shows a first embodiment of the invention in which the device of FIG. 1 has an etched substrate, and a back-gate in the etched window under the buffer layer.

FIG. 2 shows a first embodiment of the invention in which a back-side trench or etch 40 is formed in the back or bottom of substrate 10. A gate dielectric 41 is formed and patterned at the bottom of trench 40 and adjacent the buffer layers 11. A conductive back-gate or secondary gate 42 is then deposited on dielectric 41 and is suitably patterned. Back-gate 42 is laterally aligned with and is under gate 23.

Back-gate 42 can be connected to main gate 23 or can have its own terminal 43 as shown which is connected to gate potential or any potential desired. The application of a negative voltage to back-gate 42 reduces leakage paths in GaN layer 12 between source and drain 20 and 21 respectively and also improves the sub threshold characteristics. The transconductance of the device also improves since the back-gate 42 introduces 2 DEG channel 14 control from the back-side of the device.

In a typical device, a silicon substrate 10 having a thickness of 600 µm and resistivity of 10 ohm cm can be used (non-critical). The web 50 between the bottom of trench 40 and the bottom of buffer layer 11 may be about 1.0 µm.

The back-gate size may be varied to achieve optimal sub-threshold and transconductance characteristics. Thus, in one design the trench 40 may have a depth of 80 µm and a width of 1 µm, and gate 42, which may be metal, polysilicon, or the like may have a width of: 4 µm and a thickness of 0.2 µm. Dielectric 41 may have a thickness of 0.02 µm and may be of $SiO_2$ or the like. The buffer layer 11 in this design may have a thickness of 0.8 µm and the GaN layer 12 may have a thickness of 0.8 µm.

Figure 3:
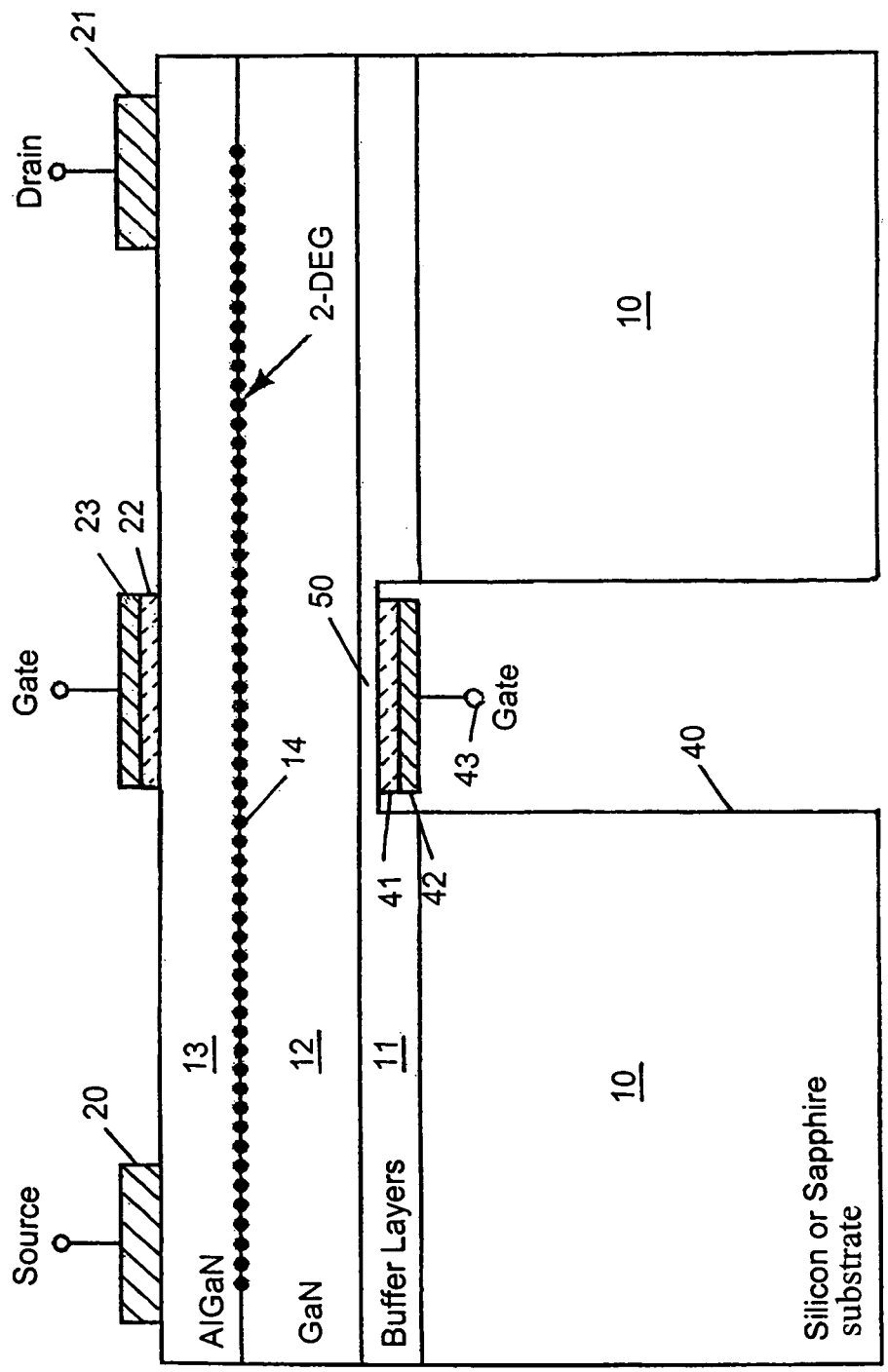
FIG. 3 shows a further embodiment of the invention in which the etch and the back-gate extend into the transition layer.

FIG. 3 shows a second embodiment of the invention in which the trench 40 (formed by any well know technique) is deeper than in FIG. 2 and extends into buffer layers 11 by about 0.5 µm. This places the back-gate 42 closer to the 2 DEG layer 14. The closer placement of gate 42 to 2 DEG layer 14 allows further improvements such as even less leakage and better transconductance and subthreshold slope.

Figure 4:
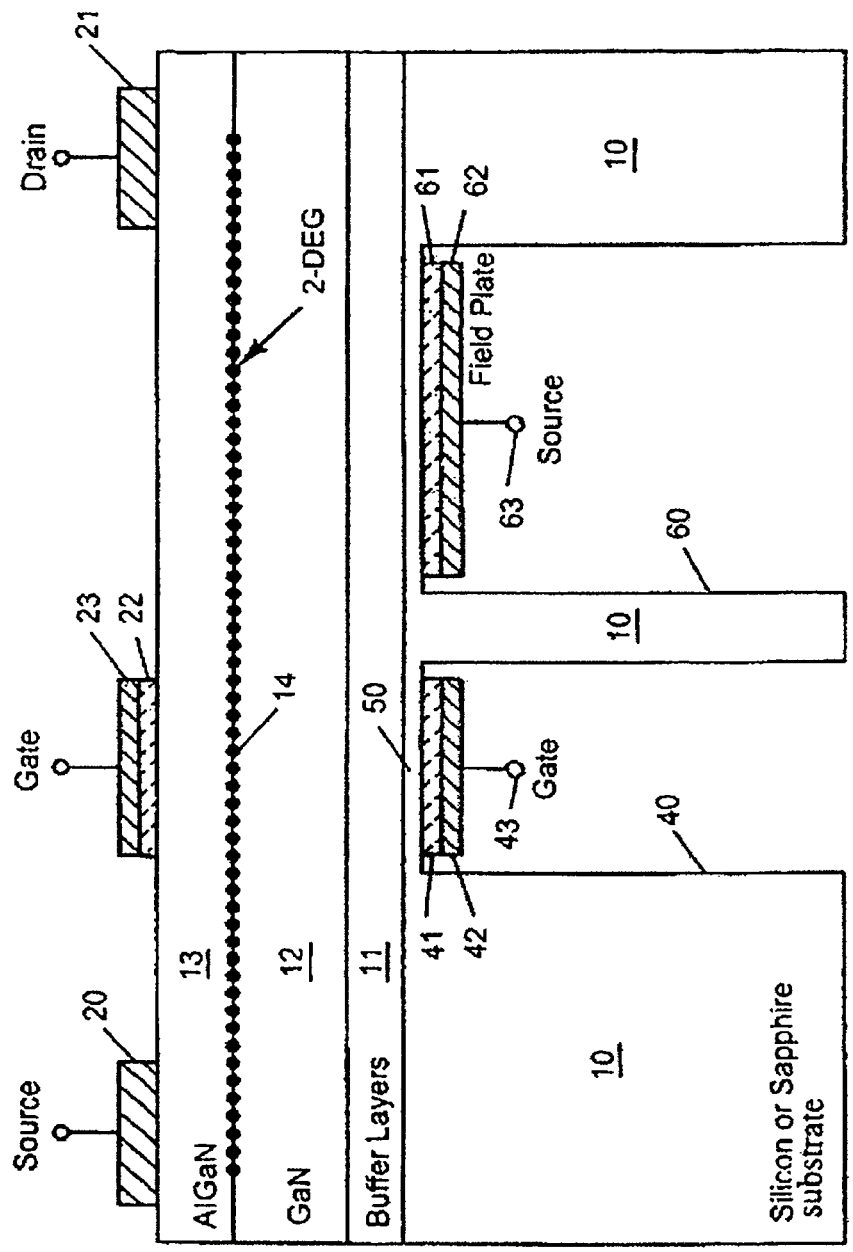
FIG. 4 shows a still further embodiment of the invention in which a further etch is formed in the device of FIG. 2 and a field plate is added at the bottom of the further etch.

FIG. 4 shows a further embodiment of the invention in which a field plate is added to the embodiment of FIG. 2. Thus, in FIG. 4, a second trench 60 is etched into substrate 10 and under the drift region in GaN layer 12 between the gate 23 and drain 21. Trench 60 receives a dielectric layer 61 and conductive field plate 62 which are coplanar with dielectric 41 and back-gate 42 and may have the same thicknesses and are deposited and patterned in the same deposition and etch steps. Field plate 62 has a terminal 63 which may be connected to source electrode 20.

By applying an appropriate bias to field plate 63 (e.g. the source potential) one is able to shape the electric field in the drift region between drain 21 and gate 23 and close to the gate region, to produce a higher breakdown voltage, less impact ionization and more reliable device operation.

Figure 5:
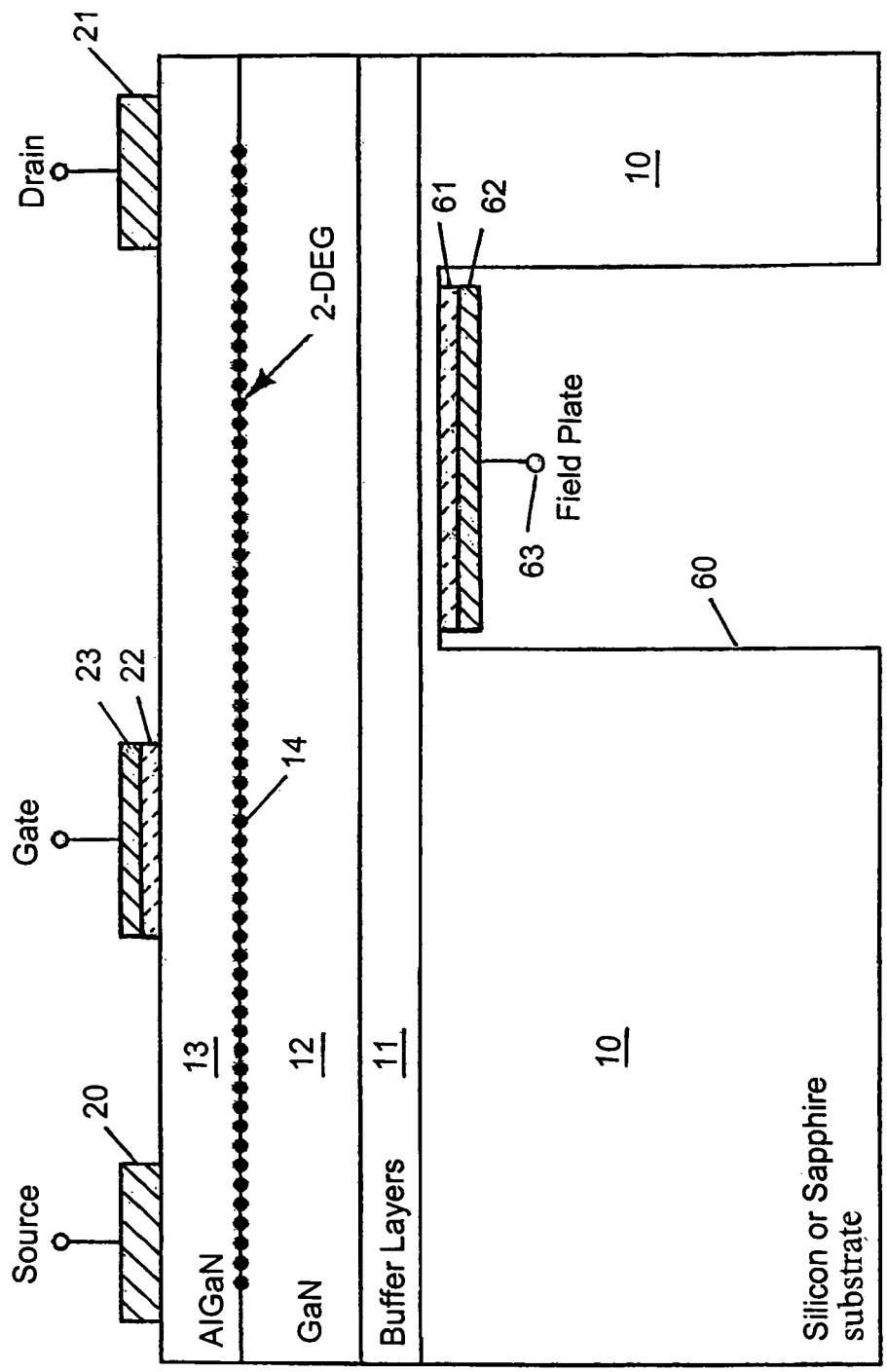
FIG. 5 shows a further embodiment of the invention in which a single etch receives a field plate.

In a still further embodiment of the invention, and as shown in FIG. 5, the device of FIG. 43 can be modified to have only the described field plate structure and the benefits offered thereby.

Figure 6:
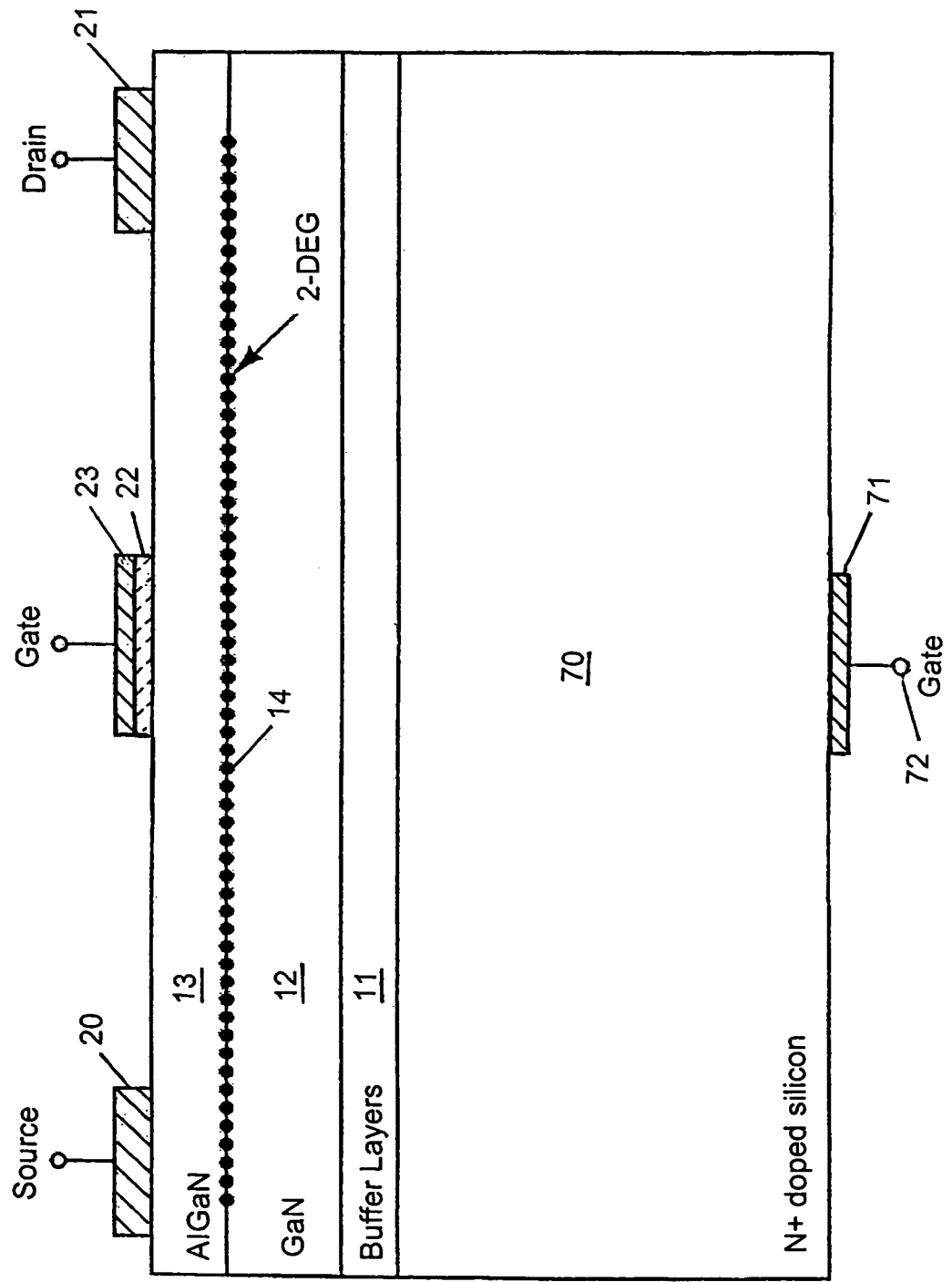
FIG. 6 shows a still further embodiment of the invention in which the back-gate of FIG. 2 is formed by a silicon substrate of increased conductivity which can be connected to the device control gate or to some other potential.

In a still further embodiment of the invention, as shown in FIG. 6, the structure of FIG. 2 is modified to employ a highly conductive silicon substrate 70, which may have a resistivity of from 0.02 ohm cm to 0.5 ohm cm, and preferably 0.03 ohm cm. The thickness of substrate 70 may be from 600 µm to 1000 µm.

A contact 71 having terminal 72 may be formed on the bottom of substrate 70 and is connected to gate 23 to improve device characteristics as described. Alternatively, conductive substrate 70 may be connected to source 20 to act as a field plate.

With the highly conductive substrate 70, one needs to control the charge that is introduced by the very large back-side gate.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A III-Nitride device having improved transconductance, said device comprising:
    a substrate;
    a first III-nitride layer supported by said substrate;
    a second III-Nitride layer atop said first III-Nitride layer and creating a 2 DEG conducting layer at the interface of said first and second III-Nitride layers;
    first and second spaced main electrodes connected to said second III-Nitride layer;
    a main gate structure connected to said second III-Nitride layer and disposed laterally between said first and second main electrodes and adapted to adjustably change the conductivity of said 2 DEG layer beneath said main gate structure in response to a predetermined signal on said main gate structure; and
    a back-gate structure having a lateral position in alignment with a lateral position of said main gate structure and beneath said 2 DEG layer;
    said lateral position of said back-gate structure not overlapping with a lateral position of said first main electrode and a lateral position of said second main electrode; and
    said back-gate structure electrically connected to a potential of said main gate structure; and
    said back-gate structure disposed within a trench without exposing said first III-Nitride layer, wherein a web portion of said substrate is disposed between a bottom surface of said trench and said first III-Nitride layer.

2. The device of claim 1, which further includes a transition layer disposed between said substrate and said first III-Nitride layer.

3. The device of claim 1, wherein said first and second III-Nitride layers comprise a GaN layer and an AlGaN layer respectively.

4. The device of claim 2, wherein said first and second III-Nitride layers comprise a GaN layer and an AlGaN layer respectively.

5. The device of claim 1, wherein said first and second electrodes comprise source and drain electrodes respectively.

6. The device of claim 4, wherein said first and second electrodes comprise source and drain electrodes respectively.

7. The device of claim 1, wherein said main gate stricture comprises a gate dielectric layer on said second III-Nitride layer and a conductive gate layer atop said dielectric layer.

8. The device of claim 6, wherein said main gate structure comprises a Schottky gate on said second III-Nitride layer.

9. The device of claim 1, wherein a bottom of said trench is contained within said substrate.

10. The device of claim 1, wherein a bottom of said trench is contained in said transition layer.

11. The device of claim 9, wherein said main gate structure comprises a gate dielectric layer on said second III-Nitride layer and a conductive gate layer atop said dielectric layer.

12. The device of claim 10, wherein said main gate structure comprises a gate dielectric layer on said second III-Nitride layer and a conductive gate layer atop said dielectric layer.

13. The device of claim 1, which further includes a field plate structure having a lateral position in alignment with a lateral position of at least a portion of the drift region between said main gate structure and said second electrode and beneath said 2 DEG layer; said field plate connected to the potential of said first electrode.

14. The device of claim 5, which further includes a field plate structure having a lateral position in alignment with a lateral position of at least a portion of the drift region between said main gate structure and said second electrode and beneath said 2 DEG layer; said field plate connected to the potential of said source.

15. The device of claim 7, which further includes a field plate structure having a lateral position in alignment with a lateral position of at least a portion of the drift region between said main gate structure and said second electrode and beneath said 2 DEG layer; said field plate connected to the potential of said first electrode.

16. The device of claim 13, wherein said field plate comprises a dielectric layer and a conductive layer atop said field plate dielectric layer.

17. The device of claim 13, which further includes a second trench in the bottom of said substrate and having a given depth; said field plate structure disposed at the bottom of said second trench.

18. The device of claim 17, wherein said field plate comprises a dielectric layer and a conductive layer atop said field plate dielectric layer.

19. A III-Nitride device comprising a substrate;
a first III-nitride layer supported by said substrate;
a second III-Nitride layer atop said first III-Nitride layer and creating a 2 DEG conducting layer at the interface of said first and second III-Nitride layers;
first and second spaced main electrodes connected to said second III-Nitride layers;
a main gate structure connected to said second III-Nitride layer and disposed between said first and second main electrodes and adapted to adjustably change the conductivity of said 2 DEG layer beneath said main gate structure in response to a predetermined signal on said main gate structure; and
a field plate structure having a lateral position in alignment with a lateral position of at least a portion of the drift region between said main gate structure and said second electrode and beneath said 2 DEG layer;
said field plate structure not laterally extending beyond said drift region; and
said field plate structure electrically connected to a potential of said first main electrode.

20. The device of claim 19, which further includes a transition layer disposed between said substrate and said first III-Nitride layer.

21. The device of claim 19, wherein said first and second III-Nitride layers comprise a GaN layer and an AlGaN layer respectively.

22. The device of claim 19, wherein said field plate comprises a dielectric layer beneath said 2 DEG layer and a conductive layer underneath said dielectric layer.

23. The device of claim 19, which further includes a trench in the bottom of said substrate and having a given depth; said field plate structure disposed at the bottom of said trench.

24. The device of claim 23, wherein said trench bottom is disposed within said substrate.

25. The device of claim 23, wherein the bottom of said trench is disposed in said transition layer.

* * * * *